(12) United States Patent
De Boeij et al.

(10) Patent No.: US 9,875,879 B2
(45) Date of Patent: Jan. 23, 2018

(54) CHARGED PARTICLE MICROSCOPE WITH VIBRATION DETECTION / CORRECTION

(71) Applicant: FEI Company, Hillsboro, OR (US)

(72) Inventors: Jeroen De Boeij, 's-Hertogenbosch (NL); Johannes Antonius Maria Van den Oetelaar, Eindhoven (NL); Albert Visscher, Veldhoven (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 15/243,753

(22) Filed: Aug. 22, 2016

(65) Prior Publication Data

US 2017/0125209 A1    May 4, 2017

(30) Foreign Application Priority Data

Nov. 2, 2015  (EP) ..................... 15192523

(51) Int. Cl.
*H01J 37/26* (2006.01)
*H01J 37/24* (2006.01)
(Continued)

(52) U.S. Cl.
CPC .............. *H01J 37/24* (2013.01); *H01J 37/20* (2013.01); *H01J 37/226* (2013.01);
(Continued)

(58) Field of Classification Search
CPC ..... H01J 2237/0216; H01J 2237/24592; H01J 37/28; H01J 37/20; H01J 2237/26;
(Continued)

(56) References Cited

U.S. PATENT DOCUMENTS 3,833,811 A * 9/1974 Koike ................... H01J 37/153
                                                250/306
5,814,814 A * 9/1998 Kanemitsu .............. H01J 37/28
                                                250/310
(Continued)

FOREIGN PATENT DOCUMENTS

JP        2005166538 A    6/2005

OTHER PUBLICATIONS

"Electron Microscope", Wikipedia, Retrieved from the Internet Oct. 15, 2015, http://en.wikipedia.org/wiki/Electron_microscope, 11 pages.
(Continued)

*Primary Examiner* — Wyatt Stoffa
(74) *Attorney, Agent, or Firm* — Scheinberg & Associates, P.C.; Michael O. Scheinberg (57) ABSTRACT

A method of using a Charged Particle Microscope comprising:
  A specimen holder, connected to a positioning stage, for holding a specimen;
  A source, for producing a beam of charged particles;
  An illuminator, for directing said beam so as to irradiate the specimen;
  A detector, for detecting a flux of radiation emanating from the specimen in response to said irradiation,
comprising the following steps:
  Providing the microscope with an interferential optical position sensor for determining a position of said specimen holder relative to a reference;
  Providing an automatic controller with a time-dependent position signal from said optical position sensor;
  Invoking said controller to use said signal to produce a vibration profile for the microscope.

20 Claims, 3 Drawing Sheets

(51) Int. Cl.
  H01J 37/20    (2006.01)
  H01J 37/244   (2006.01)
  H01J 37/22    (2006.01)
(52) U.S. Cl.
  CPC .......... H01J 37/244 (2013.01); H01J 37/268 (2013.01); *H01J 2237/0216* (2013.01)
(58) Field of Classification Search
  CPC .... H01J 37/16; H01J 37/268; H01J 2237/245; H01J 37/26
  See application file for complete search history.

(56) References Cited

U.S. PATENT DOCUMENTS

| | | | | |
|---|---|---|---|---|
| 6,043,490 | A * | 3/2000 | Sakai | H01J 37/02 250/306 |
| 6,677,587 | B2 * | 1/2004 | Kohama | G01N 23/2251 850/9 |
| 7,230,257 | B2 * | 6/2007 | Uchida | B82Y 10/00 250/396 R |
| 7,633,074 | B2 * | 12/2009 | Frosien | H01J 37/08 250/306 |
| 9,129,353 | B2 * | 9/2015 | Shirai | H01J 37/28 |
| 2006/0219911 | A1 * | 10/2006 | Miyao | G01N 23/225 250/311 |
| 2007/0085035 | A1 * | 4/2007 | Frosien | H01J 37/08 250/492.3 |
| 2008/0121804 | A1 * | 5/2008 | Nakasuji | G01N 23/225 250/310 |
| 2009/0001266 | A1 * | 1/2009 | Frosien | H01J 37/08 250/307 |
| 2011/0101222 | A1 * | 5/2011 | Wang | H01J 37/20 250/307 |
| 2013/0301954 | A1 * | 11/2013 | Shirai | H01J 37/28 382/280 |
| 2014/0312246 | A1 * | 10/2014 | Takahashi | H01J 37/20 250/453.11 |
| 2016/0133437 | A1 | 5/2016 | Moers et al. | |
| 2016/0284506 | A1 * | 9/2016 | Ogawa | H01J 37/20 |
| 2016/0307726 | A1 * | 10/2016 | Hatakeyama | G01N 23/2251 |

OTHER PUBLICATIONS

"Scanning Electron Microscope", Wikipedia. Retrieved from the Internet Jul. 25, 2016, http://en.wikipedia.org/wiki/Scanning_electron_microscope, 23 pages.

"Scanning Helium Ion Microscope", Wikipedia, Retrieved from the Internet on Jul. 25, 2016, http://en.wikipedia.org/wiki/Scanning_Helium_Ion_Microscope, 2 pages.

"Scanning Transmission Electron Microscopy", Wikipedia, Retrieved from the Internet Jul. 25, 2016, http://en.wikipedia.org/wiki/Scanning_transmission_electron_microscopy, 5 pages.

"Transmission Electron Microscopy", Wikipedia, Retrieved from the Internet Jul. 25, 2016, http://en.wikipedia.org/wiki/Transmission_electron_microscopy, 23 pages.

Escovitz, W.H. et al., "Scanning Transmission Ion Microscope with a Field Ion Source," Proc. Nat. Acad. Sci. USA, May 1975, pp. 1826-1828, vol. 72, No. 5.

Heidenhain, Measurement and Control Technology for Demanding Positioning Tasks, Retrieved from the Internet Nov. 15, 2016; http://www.heidenhain.com/, 3 pages.

Zygo, Laser Interferometers, Retrieved from the Internet Nov. 15, 2016; http://www.zygo.com/?/met/interferometers/, 2 pages.

* cited by examiner

CHARGED PARTICLE MICROSCOPE WITH VIBRATION DETECTION / CORRECTION

The invention relates to a method of using a Charged Particle Microscope comprising:
- A specimen holder, connected to a positioning stage, for holding a specimen;
- A source, for producing a beam of charged particles;
- An illuminator, for directing said beam so as to irradiate the specimen;
- A detector, for detecting a flux of radiation emanating from the specimen in response to said irradiation.

Charged particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various subspecies, such as so-called "dual-beam" tools (e.g. a FIB-SEM), which additionally employ a "machining" Focused Ion Beam (FIB), allowing supportive activities such as ion-beam milling or Ion-Beam-Induced Deposition (IBID), for example. More specifically:
- In a SEM, irradiation of a specimen by a scanning electron beam precipitates emanation of "auxiliary" radiation from the specimen, in the form of secondary electrons, backscattered electrons, X-rays and photoluminescence (infrared, visible and/or ultraviolet photons), for example; one or more components of this flux of emanating radiation is/are then detected and used for image accumulation purposes.
- In a TEM, the electron beam used to irradiate the specimen is chosen to be of a high-enough energy to penetrate the specimen (which, to this end, will generally be thinner than in the case of a SEM specimen); the flux of transmitted electrons emanating from the specimen can then be used to create an image. When such a TEM is operated in scanning mode (thus becoming a STEM), the image in question will be accumulated during a scanning motion of the irradiating electron beam.

More information on some of the topics elucidated here can, for example, be gleaned from the following Wikipedia links:

http://en.wikipedia.org/wiki/Electron_microscope
http://en.wikipedia.org/wiki/Scanning_electron_microscope
http://en.wikipedia.org/wiki/Transmission_electron microscopy
http://en.wikipedia.org/wiki/Scanning_transmission_electron_microscopy As an alternative to the use of electrons as irradiating beam, charged particle microscopy can also be performed using other species of charged particle. In this respect, the phrase "charged particle" should be broadly interpreted as encompassing electrons, positive ions (e.g. Ga or He ions), negative ions, protons and positrons, for instance. As regards ion-based microscopy, some further information can, for example, be gleaned from sources such as the following:

http://en.wikipedia.org/wiki/Scanning_Helium_Ion_Microscope
W. H. Escovitz, T. R. Fox and R. Levi-Setti, *Scanning Transmission Ion Microscope with a Field Ion Source*, Proc. Nat. Acad. Sci. USA 72(5), pp. 1826-1828 (1975).

It should be noted that, in addition to imaging, a charged particle microscope may also have other functionalities, such as performing spectroscopy, examining diffractograms, performing (localized) surface modification (e.g. milling, etching, deposition), etc.

In all cases, a Charged Particle Microscope (CPM) will comprise at least the following components:
- A radiation source, such as a Schottky electron source or ion gun.
- An illuminator, which serves to manipulate a "raw" radiation beam from the source and perform upon it certain operations such as focusing, aberration mitigation, cropping (with an aperture), filtering, etc. It will generally comprise one or more (charged-particle) lenses, and may comprise other types of (particle-) optical component also. If desired, the illuminator can be provided with a deflector system that can be invoked to cause its output beam to perform a scanning motion across the specimen being investigated.
- A specimen holder, on which a specimen under investigation can be held and positioned (e.g. tilted, rotated). If desired, this holder can be moved so as to effect scanning motion of the beam w.r.t. the specimen. In general, such a specimen holder will be connected to a positioning system such as a mechanical stage (typically with multiple degrees of motional freedom).
- A detector (for detecting radiation emanating from an irradiated specimen), which may be unitary or compound/distributed in nature, and which can take many different forms, depending on the radiation being detected. Examples include photomultipliers (including solid state photomultipliers, SSPMs), photodiodes, CMOS detectors, CCD detectors, photovoltaic cells, etc., which may, for example, be used in conjunction with a scintillator film, for instance.

In the case of a transmission-type microscope (such as a (S)TEM, for example), the CPM will also comprise:
- An imaging system, which essentially takes charged particles that are transmitted through a specimen (plane) and directs (focuses) them onto analysis apparatus, such as a detection/imaging device, spectroscopic apparatus (such as an EELS module), etc. As with the illuminator referred to above, the imaging system may also perform other functions, such as aberration mitigation, cropping, filtering, etc., and it will generally comprise one or more charged-particle lenses and/or other types of particle-optical components.

In what follows, the invention may—by way of example—sometimes be set forth in the specific context of electron microscopy. However, such simplification is intended solely for clarity/illustrative purposes, and should not be interpreted as limiting.

Although known CPMs produce tolerable imaging results, there is always room for improvement. In that context, the current inventors have worked extensively to identify shortcomings in conventional CPM designs, and to address these effectively so as to produce improved CPM performance. The results of such endeavor are the subject of the current application.

It is an object of the invention to provide an improved CPM as referred to above. In particular, it is an object of the invention that such a CPM should (ultimately) yield improved imaging results compared to conventional microscopes. Moreover, it is an object of the invention that this innovative CPM should feature enhanced self-diagnostic functionality.

These and other objects are achieved in a method as set forth in the opening paragraph above, characterized by the following steps:

Providing the microscope with an interferential optical position sensor for determining a position of said specimen holder relative to a reference;

Providing an automatic controller with a time-dependent position signal from said optical position sensor;

Invoking said controller to use said signal to produce a vibration profile for the microscope.

For good order, the following points should be noted with regarded to certain aspects of the terminology used to elucidate the current invention:

The phrase "interferential optical position sensor" (IOPS) should be interpreted as referring to sensors that employ electromagnetic wave interference effects to produce countable intensity fluctuations that change as a function of positional variation (motion). Such sensors may also be regarded as "fringe-counting" sensors, and may exploit diffraction effects. They are typically able to attain a positional resolution that is (significantly) smaller than the wavelength(s) of the light that they employ. This type of sensor encompasses, for example:

Interferometers, in which a "dynamic"/measurement light beam (reflected from a movable reflector) is allowed to interfere with a "static"/reference light beam, producing interference fringes.

Such interferometers are, for example, commercially available from the firm Zygo Corporation, Middlefield, Conn., USA:

http://www.zygo.com/?/met/interferometers/

Optical encoders, in which a light beam is caused to traverse a series of gratings (e.g. diffraction/holographic gratings), producing diffraction orders that can be analyzed using interference effects.

Such encoders are, for example, commercially available from the firm Dr. Johannes Heidenhain GmbH, Traunreut, Germany:

www.heidenhain.com

IOPSs may be used to measure linear and/or angular position/motion. They may be used in groups, so as to cover multiple degrees of positional freedom.

The "reference" used for relative position determination may be (part of) the illuminator, (part of) the employed detector, a machine frame on which various sub-components of the microscope are (rigidly) mounted, a stator of the employed positioning stage, etc. In general, a first component (e.g. laser head) of the IOPS will be mounted on this reference, whereas a second (co-operating) component (e.g. a grating or retroflector) of the IOPS will be mounted on a mover/rotor of the positioning stage, or on the specimen holder, for instance. See, also, the remarks below relating to "differential measurement".

The automatic controller may have a unitary or compound nature, and may, for example, comprise a group of cooperating sub-controllers, each of which can be assigned specific sub-tasks. It may, for instance, be a specifically designed analog or digital electronic circuit, or it may comprise (part of) a computer processor, which can execute commands written in software/firmware. It may be part of a master controller used to generally coordinate automated processes within the CPM, or it may be a dedicated device.

The phrase "vibration profile" should be interpreted as encompassing, for example, a graph of positional fluctuation versus time, a frequency spectrum, etc., from which one can derive information regarding vibrational behavior of (part of) the microscope.

In charged-particle microscopy, there is an ongoing drive toward ever-finer imaging resolution. As a result, there is an increasing need to be able to:

Position/move a specimen accurately and reproducibly with respect to the internal microscope environment (particle-optical axis, detector, etc.);

Maintain a given specimen position/posture in a stable manner;

Mitigate environmental influences that can adversely affect positioning accuracy of the specimen, such as vibration, thermal drift, etc.

In the context of such demands, the inventors concluded that conventional microscope designs needed a substantial re-think, because existing designs would not be able to satisfactorily perform beyond a given resolution threshold. In this regard, one of the changes implemented by the inventors was to switch to a positioning stage design with interferential optical position measuring, since this would allow measurement/positioning accuracy at picometer (and even sub-picometer) level; in contrast, the positioning techniques used up to now in CPM stages—which, for example, rely on the use of stepper motors and/or counters that slide over light/dark segmented rulers—can only achieve accuracy in a range of about 1-50 nm (depending on implementation). This switch to a novel sensor architecture then, for the first time, allowed a different way to measure the abovementioned environmental influences. In conventional CPMs, such influences can be studied to a limited extent by loading and imaging a calibration specimen that comprises a regular atomic lattice of known pitch; parasitic environmental influences such as vibrations/thermal drift will then cause the particle-optical image of such a lattice to be deformed (blurred/smeared) from its optimal/nominal form. Inspection of the resulting image allows a skilled CPM operator to derive some information on the parasitic influences concerned, but this is a tedious process of limited reliability, and tends to allow only rough qualitative analysis rather than detailed quantitative characterization. Moreover, the process is time-consuming (thus incurring an undesirable uptime penalty), and requires use of a (delicate and expensive) specimen. The current invention addresses this problem in a totally different way, by employing the aforementioned IOPS as a fast, accurate and reliable means of (quantitatively and qualitatively) analyzing vibrations/drift in the CPM, without the need to load and image a sample. When the need arises (e.g. after CPM transport/installation, after service operations, after an earthquake, as a regular check-up, etc.), one can use the inventive sensor to generate a vibration/drift profile/signature/spectrum, which can then be reliably (and even automatically) analyzed to identify particular problematic/prominent frequencies present therein; in many cases, it will then be relatively straightforward to match such flagged frequencies to (resonance) effects of certain sources (objects/components) within the CPM (such as a loosely seated module or cabinet panel, vibrating power line or hose, etc.) or outside the CPM (such as floor motion, traffic vibrations, barometric fluctuations, acoustic disturbances, seismic effects, etc.), allowing measures to be taken to eliminate (or, at least, temper) such sources. In this way, the inventive sensor assumes the role of valuable diagnostic instrument.

In a refinement/extension of the invention, the signal from the inventive sensor is used as input to a control procedure to compensate for a positional error of the specimen holder relative to at least one of the illuminator and the detector. Such an approach entails active control as opposed to just passive measurement/characterization. It represents a departure from standard practice in that, instead of continually trying to make CPM structures as stiff/rigid as possible—in an attempt to prevent vibrational disturbances ab initio—one instead accepts the inevitability of such disturbances, and focuses on adaptive schemes to nullify their effects. This, in turn, further serves to substantially improve imaging performance/reliability of the CPM.

An active control embodiment as set forth in the previous paragraph can be realized in different ways. For example, one can configure a set-up in which:
- Said control procedure comprises a control loop;
- Said compensation comprises on-the-fly adjustment of a relative position of said beam and said specimen holder.

Such a control procedure can comprise feedforward and/or feedback aspects. For example:
- Certain vibrations/drift affecting the positioning stage/specimen holder will be predictable, because their time-dependency is described by a well-defined mathematical function, such as a sine curve, quadratic curve or sloped line, for example; in such cases, extrapolation can be used to predict a particular positional error at a given forward time, and predictive (feedforward) counter-adjustment can be enacted so as to produce pre-cancellation.
- Certain other vibrations may be more random/stochastic in nature, and thus difficult to subject to predictive extrapolation; nevertheless, their effects can still be addressed using feedback correction.

Regardless of whether the adjustment is feedforward and/or feedback in nature, it will essentially involve manipulation of a control setpoint. As regards the choice of setpoint in question, the present invention admits various options. For example:

(i) In a particular embodiment, the controller is invoked to adjust a position setpoint supplied to said stage in response to said signal. As set forth above, the stage will typically be able to position/move the specimen holder in multiple degrees of freedom, including both linearly (e.g. so as to choose a particular area for analysis on a specimen) and angularly (e.g. to achieve a particular specimen tilt relative to the irradiating beam). It may, for example, comprise a plurality of motors (e.g. piezoelectric or voice coil motors), pneumatic actuators, hydraulic actuators, etc. Motors are particularly advantageous in the context of the current invention because of their relatively fast response time and excellent positioning accuracy.

(ii) In an alternative or supplemental embodiment to that set forth in (i), the following applies:
- The illuminator is provided with a deflector mechanism that can be used to adjust a deflection of the beam;
- The controller is invoked to adjust a deflection setpoint supplied to said deflector mechanism in response to said signal.

A deflector mechanism as referred to here may, for example, comprise one or more of:
- A magnetic beam deflection unit, which deflects a charged-particle beam using current-carrying coils;
- An electrostatic beam deflection unit, which deflects a charged-particle beam using capacitive plates.

In general, the former (magnetic beam deflectors) tend to lend themselves more to slower, larger-amplitude deflection, whereas the latter (electrostatic beam deflectors) tend to lend themselves more to faster, smaller-amplitude deflection (although there are exceptions to this tendency, depending on the implementation involved and the deflection speeds/amplitudes required). In the case of a scanning-type microscope—such as a SEM or STEM, for example—such a deflector mechanism will generally be present anyway, for effecting scanning motion of the beam across the specimen; in such an instance, the deflector mechanism can then additionally be conveniently used to effect the on-the-fly positional corrections of the current embodiment.

In a different, but related, embodiment of the invention, the following applies:
- The microscope is provided with an imaging system, for directing a flux of charged particles transmitted through the specimen onto said detector;
- Said imaging system is provided with a steering module that can be used to adjust a path of said flux;
- The controller is invoked to adjust a steering setpoint supplied to said steering module in response to said signal.

This embodiment relates specifically to transmission-type microscopes—such as a (S)TEM—which comprise an imaging system in addition to the abovementioned illuminator. Just as with the illuminator, the particle-optical column of this imaging system can also comprise deflection apparatus—referred to here as a steering module—that can be used to steer (deflect, direct) a flux of charged particles passing through the imaging system. Once again, such a steering module may make use of magnetic and/or electrostatic deflection units as alluded to above. Such an embodiment is similar to scenario (ii) above, but performs beam deflection "downstream" of the specimen as opposed to the "upstream" correction in (ii); if desired, both upstream and downstream deflection can be applied.

In an alternative to the on-the-fly (or "online") correction describe above, the inventors also developed an ex post facto (or "offline") correction with the following aspects:
- The microscope is provided with scanning means, for producing relative scanning motion of the beam and specimen;
- The controller is invoked to construct a table of detector output as a function of scan coordinate position on the specimen;
- Said compensation comprises retrospective correction of said scan coordinate position on a point-by-point basis.

As indicated above, imaging in the case of a scanning-type microscope essentially occurs by accumulating the above-mentioned table and converting its data entries into a two-dimensional plot of detector output versus coordinate position. The table itself basically corresponds to a set of data pairs $\{D_n, (x_n, y_n)\}$, accrued at a sequence of successive sampling/pixel points whose consecutive members have increasing values of ordinal n, where $D_n$ denotes detector output at coordinate position $(x_n, y_n)$. In the current embodiment, an output signal from the employed IOPS is used to calculate a positional error $(\Delta x_n, \Delta y_n)$ associated with each coordinate position $(x_n, y_n)$. One can then perform a corrective mapping/transformation of form:

$$(x_n, y_n) \rightarrow (x_n + \Delta x_n, y_n + \Delta y_n) = (x_n', y_n')$$

and assemble a corrected image on the basis of the adjusted data set $\{D_n, (x_n', y_n')\}$. In the current context, the stipulation "point-by-point" does not necessarily require each and every coordinate position to be individually corrected; instead, (more selective) corrections may also be performed on subsets/groups of coordinate positions at a time. In particular, the stipulation should be interpreted as encompassing a 'line-by-line" correction, which might suffice for vibrations with a frequency that is relatively low compared to the line scanning frequency of the (raster) scanning motion generally employed in imaging.

In a refinement of the basic invention, the following can be realized:
- A first interferential optical position sensor is used to determine a position of said specimen holder relative to a microscope frame;
- A second interferential optical position sensor is used to determine a position of part of said illuminator relative to said microscope frame;
- Said controller utilizes a position signal from each of said first and second optical position sensors to calculate a relative position of said stage and said illuminator.

Such a "differential measurement" is advantageous in that it (ultimately) measures the position of the specimen holder relative to the illuminator. In a less sophisticated approach, one can assume (at certain frequencies, at least) that the illuminator and microscope frame are sufficiently stiff/rigid that measurement of the holder/stage position relative to (a stator fixed to) the frame effectively amounts to measurement relative to the illuminator also. And, as already stated above, one can alternatively elect to use the illuminator as a direct reference for the position measurement of the holder, e.g. by mounting a reflector on both and directly measuring the optical path length between these two reflectors. The approach used is a matter of choice, influenced inter alia by the particular construction of the microscope, the vibration frequencies/amplitudes of (predominant) interest, the desired level of accuracy, etc.

In a particular embodiment of the present invention, use is made of a filter to adjust effects of vibrations in a selected frequency range. Such a filter may, for example, comprise low-pass, high-pass or band-pass aspects. It may be used to attenuate or to amplify certain frequencies. For example:
- One could use a (high-pass) filter to discount effects of relatively low-frequency positional variations associated with weather phenomena. Such weather-related pressure variations have characteristic frequencies of the order of about $10^{-5}$-$10^{-4}$ Hz, corresponding to change on a timescale of hours or days, and one may judge it to be unnecessary/undesirable to correct for them, since their intra-image effect on a (relatively short) microscopic imaging session will be negligible. In this case, a (high-pass) filter could be employed to discount the frequencies in question, e.g. choosing a cutoff for frequencies below about 0.01 Hz, for instance.
- One could use a (low-pass) filter to discount effects of relatively high-frequency, low-amplitude positional variations associated with acoustic phenomena, e.g. sound in the human audible frequency range (ca. 20 Hz-20 kHz)—for instance as (relatively) constant ambient sound around the CPM caused by equipment, human activity/speech, etc. In this case, one could employ a (low-pass) filter to discount frequencies above (say) 100 Hz, for instance.

It should be noted that, in the context of the present invention, the relative positional error of the beam and specimen holder may be one- or multi-dimensional (depending inter alia on the structure and operation of the specimen holder) and the correction(s) applied thereto may also be one- or multi-dimensional (depending inter alia on what is considered (most) necessary/expedient, and on available space/resources, for example). Defining, for instance, a Cartesian coordinate system in which the beam nominally propagates along the Z direction and in which a (non-tilted) specimen nominally lies within the XY plane, the error encountered/corrected may have components in one or more of X, Y, Z, Rx, Ry and Rz (where Ri denotes rotation about axis i, with Rx, Ry and Rz often referred to as "Roll", "Pitch" and "Yaw", for example). In a situation where an applied correction is multidimensional, it should be noted that a different (correctional) amplifier gain may be associated with different directions.

The invention will now be elucidated in more detail on the basis of exemplary embodiments and the accompanying schematic drawings, in which.

In the Figures, where pertinent, corresponding parts may be indicated using corresponding reference symbols.

EMBODIMENT 1

Figure 1:
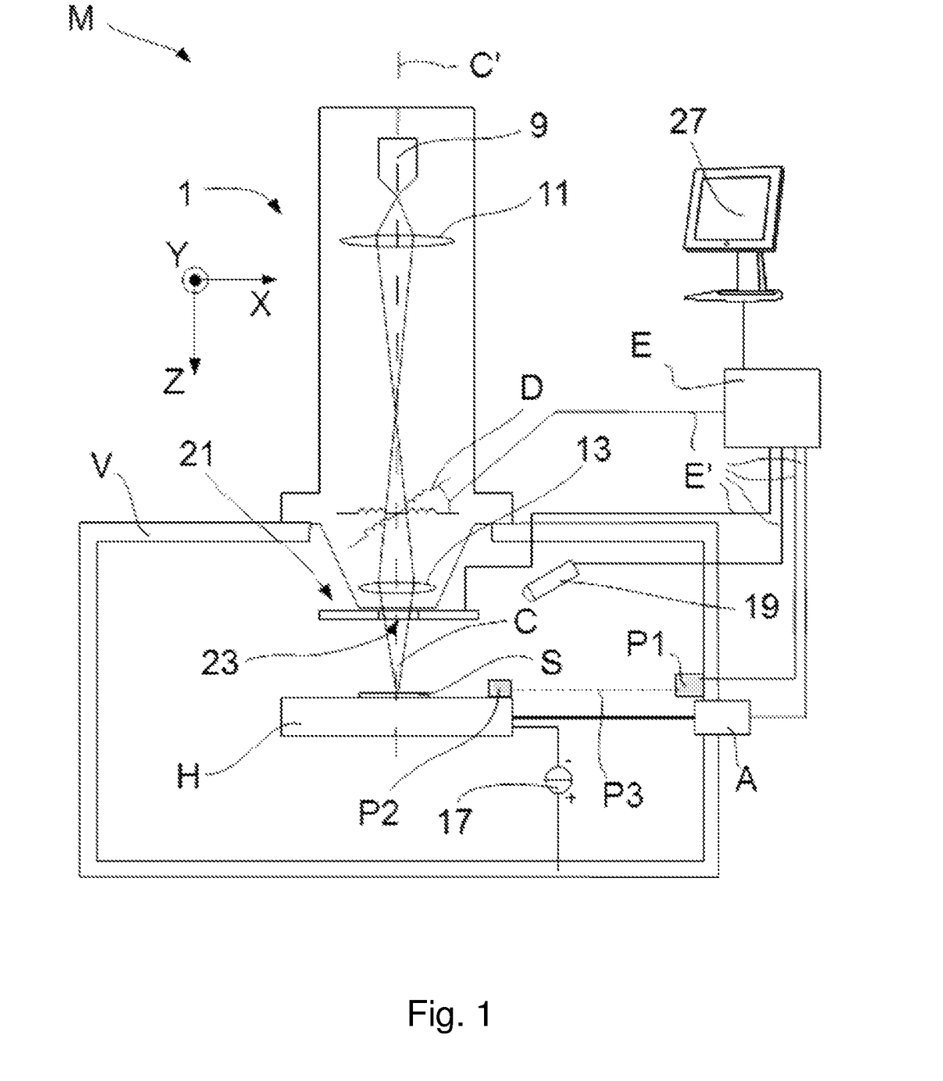
FIG. 1 renders a cross-sectional view of an embodiment of a (scanning-type) charged particle microscope in which the present invention can be enacted.

FIG. 1 is a highly schematic depiction of an embodiment of a CPM according to the present invention; more specifically, it shows an embodiment of a scanning-type microscope M, which, in this case, is a SEM (though, in the context of the current invention, it could just as validly be an ion-based microscope, for example). The microscope M comprises a particle-optical column/illuminator 1, which produces a beam C of input charged particles (in this case, an electron beam) that propagates along a particle-optical axis C'. The particle-optical column 1 is mounted on a vacuum chamber V, which comprises a specimen holder H and associated positioning stage/actuator A for holding/positioning a specimen S. The vacuum chamber V is evacuated using vacuum pumps (not depicted). With the aid of voltage source 17, the specimen holder H, or at least the specimen S, may, if desired, be biased (floated) to an electrical potential with respect to ground.

The particle-optical column 1 comprises an electron source 9 (such as a Schottky emitter), lenses 11, 13 to focus the electron beam C onto the specimen S, and a deflection unit D (to perform beam deflection/scanning of the beam C). The apparatus M further comprises a controller/computer processing apparatus E for controlling inter alia the deflection unit D, lenses 11, 13 and detectors 19, 21 and displaying information gathered from the detectors 19, 21 on a display unit 27.

The detectors 19, 21 are chosen from a variety of possible detector types that can be used to examine different types of output radiation flux emanating from the specimen S in response to irradiation by the input beam C. In the apparatus depicted here, the following detector choices have been made:
- Detector 19 is a boron-doped solid state detector that is used to detect (at least a portion of) a flux of output electrons emanating from the specimen S;
- Detector 21 is a segmented electron detector, comprising a plurality of independent detection segments (e.g. quadrants) disposed about a central aperture 23 (allowing passage of the beam C). Such a detector can, for example, be used to investigate the angular dependence of a flux of output (secondary or backscattered) electrons emerging from the specimen S.

As here rendered, both detectors 19 and 21 are used to examine electrons; however, this is purely a design/implementation choice and, if desired, one could also elect to detect other types of output radiation flux emanating from the specimen S (e.g. X-rays, cathodoluminescence) in addition, or as an alternative, to electrons.

By scanning the input beam C over the specimen S, output radiation—comprising, for example, a flux of X-rays, infrared/visible/ultraviolet light, secondary electrons and or backscattered (BS) electrons—emanates from the specimen S. Since such output radiation is position-sensitive (due to said scanning motion), the information obtained from the detectors 19, 21 will also be position-dependent. This fact allows the output of detector 19 (for instance) to be used to produce (for example) a backscattered electron image of (part of) the specimen S, which image is basically a map of an output of detector 19 as a function of scan-path position on the specimen S.

The signals from the detectors 19, 21 pass along control lines (buses) E', are processed by the controller E, and displayed on display unit 27. Such processing may include operations such as combining, integrating, subtracting, false colouring, edge enhancing, and other processing known to the skilled artisan. In addition, automated recognition processes (e.g. as used for particle analysis) may be included in such processing.

It should be noted that many refinements and alternatives of such a set-up will be known to the skilled artisan, including, but not limited to:
  The use of dual beams—for example an electron beam C for imaging and an ion beam for machining (or, in some cases, imaging) the specimen S;
  The use of a controlled environment at the specimen S—for example, maintaining a pressure of several mbar (as used in a so-called Environmental SEM) or by admitting gases, such as etching or precursor gases,
etc. Although the scanning-type microscope shown in FIG. 1 is a SEM, it could, in the context of the current invention, just as validly be a STEM, for example (see Embodiment 4 below).

In the context of the current invention, the microscope M is provided with an interferential optical position sensor (IOPS) P1, P2, P3 for determining a position of the specimen holder H relative to a reference P1. This IOPS comprises two co-operating components P1, P2—one of which is (for example) a laser head and the other of which is (for example) a grating or retroflector—which interact with one another via light beam P3, allowing the position of P2 w.r.t. P1 (or vice versa) to be determined/derived in at least one degree of freedom (DOF). To give some specific (non-limiting) examples:
  P1 is a laser head, P2 is a (cubic) retroflector, and they work together as a linear interferometer, allowing their separation along X to be determined (see depicted Cartesian coordinate system XYZ); or
  P2 is a laser head, P1 is linear grating extending along Y, and they work together as a linear encoder, allowing the position of P2 in the Y direction to be determined.

Item P1 may, for example, be rigidly attached to a machine frame of the microscope M, or it could be mounted on (a terminal lens element of) illuminator 1, for instance. If desired, an optical fiber (or other waveguide) can comprise part of the optical path between items P1 and P2. Regardless of implementation, the current invention passes a time-dependent position signal from IOPS P1, P2, P3 to automatic controller E (or another controller), where it is used to produce a vibration profile (signature, spectrum) for (the holder H within) microscope M.

In a further refinement, said signal from IOPS P1, P2, P3 is used as input to a control procedure (in controller E, or another controller) to compensate for a positional error of specimen holder H relative to, for example, illuminator 1 and/or one of detectors 19, 21. For example, if vibration or drift causes a registered positional shift (error) $\Delta X$ of holder H (w.r.t. reference P1), then one can negate/mitigate this by applying a positional compensation/correction $-\Delta X$, with the aim of restoring the relative position of (for example) the beam C and holder H to a nominal value. As here illustrated, this correction can, for example, be realized by appropriately adjusting a driving signal (voltage or current) to beam deflector D and/or stage A. This may be done in a feedforward and/or feedback procedure.

EMBODIMENT 2

Figure 2:
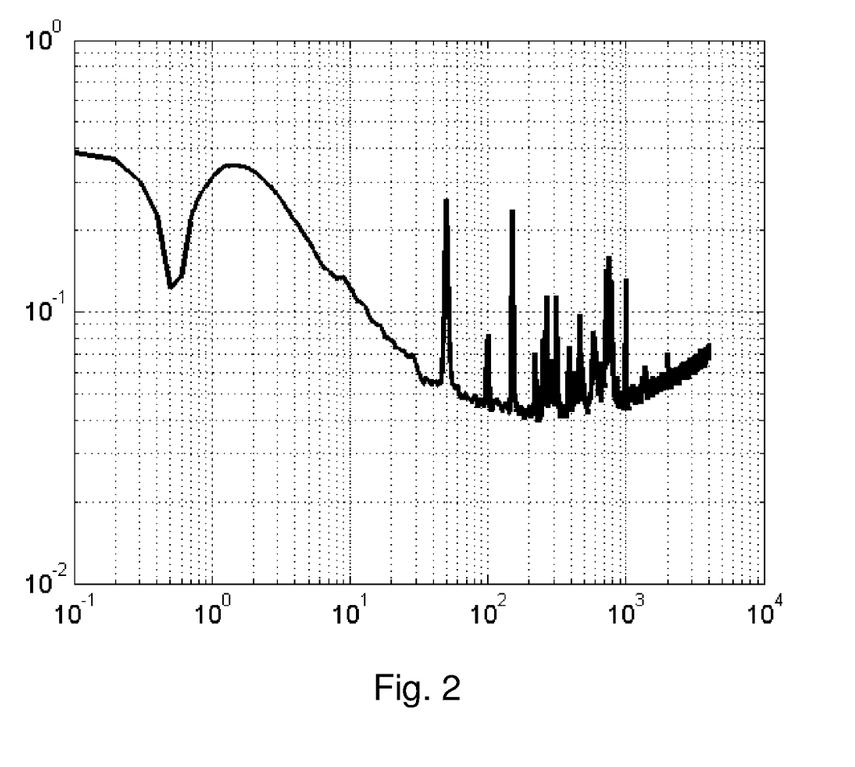
FIG. 2 shows an example of a vibration profile that can be generated using the present invention.

FIG. 2 shows an example of a vibration profile (signature/spectrum) that can be generated using the present invention. The Figure renders a graph of measured disturbance (~m $Hz^{-1/2}$) versus frequency (in Hz), using logarithmic scaling. In particular, the graph reveals the following features of note:
  A pronounced peak at 1 kHz. This can be attributed to vibrations caused by a turbopump used to evacuate the microscope. There is an associated harmonic at 2 kHz.
  A prominent peak at 50 Hz. This can be attributed to various electrical pumps connected to a 220V/50 Hz mains supply, where the characteristic motion of the pump motors is mechanically coupled into the microscope. There are associated harmonics at 100 Hz and 150 Hz.
  Various peaks in the range 300-800 Hz, associated with resonance behavior of a particular type of specimen holder connected to the microscope stage (which is provided with an IOPS in accordance with the present invention). Analysis of such peaks facilitates choice of an optimum type/geometry of holder, attachment interface between holder and stage, etc.

EMBODIMENT 3

Figure 3:
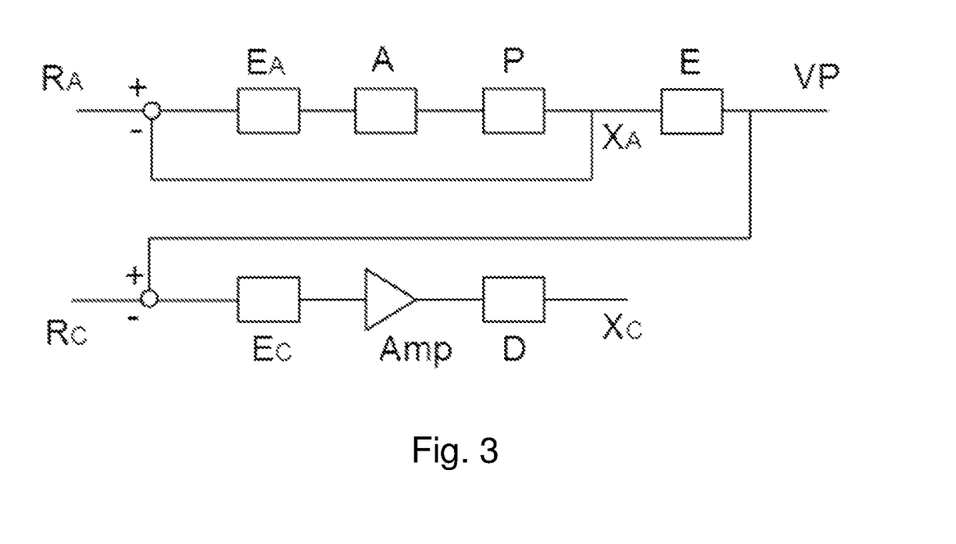
FIG. 3 shows a schematic control scheme for enaction of positional error correction according to an embodiment of the present invention.

FIG. 3 shows a schematic control scheme for enaction of positional error correction according to an embodiment of the present invention. The reference symbols in the Figure have the following meaning (refer also to FIGS. 1 and 4):
  $R_A$, $R_C$: Positional setpoints for stage/actuator A and beam C, respectively.
  $X_A$, $X_C$: The (measured) positions of stage/actuator A and beam C, respectively, relative to appropriate reference (s). The symbol "X" may, for example, represent one or more of co-ordinates X, Y, Z, Rx, Ry, Rz.
  E: General controller.
  $E_A$, $E_C$: Controllers for stage/actuator A and beam C, respectively. These may be standalone controllers, or may be sub-components of general controller E, for example.
  A: Actuator (+associated connective mechanical components) for holder H.
  P: IOPS for measuring position of stage A/holder H relative to reference.
  D: Deflector (system) for employed charged-particle beam.
  Amp: An (optional) amplifier.

VP: A vibration profile (such as that illustrated in FIG. 2, for example) for the stage/actuator A.

Such an embodiment allows a positional error registered by IOPS P to be counteracted using either or both of stage position adjustment and beam position adjustment. The skilled artisan will be able to contrive alternative and/or supplementary control schemes to that illustrated.

EMBODIMENT 4

Figure 4:
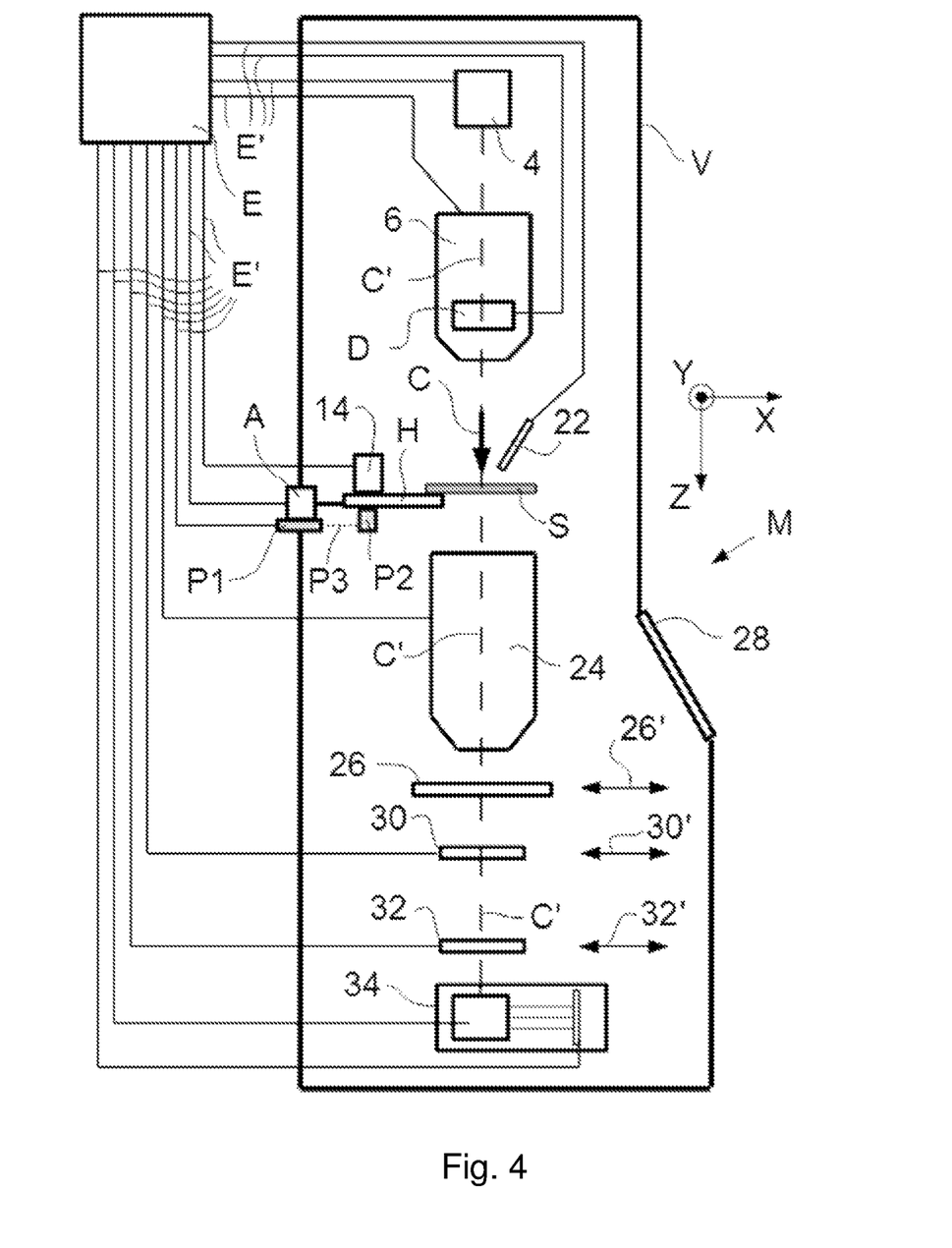
FIG. 4 renders a cross-sectional view of an embodiment of a (transmission-type) charged particle microscope in which the present invention can be enacted.

FIG. 4 is a highly schematic depiction of an embodiment of another CPM according to the current invention; more specifically, it shows an embodiment of a transmission-type microscope M, which, in this case, is a TEM/STEM (though, in the context of the current invention, it could just as validly be an ion-based microscope, for example). In the Figure, within a vacuum enclosure V, an electron source 4 (such as a Schottky emitter, for example) produces a beam (C) of electrons that traverse an electron-optical illuminator 6, serving to direct/focus them onto a chosen part of a specimen S (which may, for example, be (locally) thinned/planarized). This illuminator 6 has an electron-optical axis C', and will generally comprise a variety of electrostatic/magnetic lenses, (scan) deflector(s) D, correctors (such as stigmators), etc.; typically, it can also comprise a condenser system (the whole of item 6 is sometimes referred to as "a condenser system").

The specimen S is held on a specimen holder H that can be positioned in multiple degrees of freedom by a positioning device/stage A; for example, the specimen holder H may comprise a finger that can be moved (inter alia) in the XY plane (see the depicted Cartesian coordinate system; typically, motion parallel to Z and tilt about X/Y will also be possible). Such movement allows different parts of the specimen S to be irradiated/imaged/inspected by the electron beam traveling along axis C' (in the Z direction) (and/or allows scanning motion to be performed, as an alternative to beam scanning). An optional cooling device 14 is in intimate thermal contact with the specimen holder H, and is capable of maintaining the latter at cryogenic temperatures, e.g. using a circulating cryogenic coolant to achieve and maintain a desired low temperature.

The (focused) electron beam C traveling along axis C' will interact with the specimen S in such a manner as to cause various types of "stimulated" radiation to emanate from the specimen S, including (for example) secondary electrons, backscattered electrons, X-rays and optical radiation (cathodoluminescence). If desired, one or more of these radiation types can be detected with the aid of analysis device 22, which might be a combined scintillator/photomultiplier or EDX (Energy-Dispersive X-Ray Spectroscopy) module, for instance; in such a case, an image could be constructed using basically the same principle as in a SEM. However, alternatively or supplementally, one can study electrons that traverse (pass through) the specimen S, emerge (emanate) from it and continue to propagate (substantially, though generally with some deflection/scattering) along axis C'. Such a transmitted electron flux enters an imaging system (combined objective/projection lens) 24, which will generally comprise a variety of electrostatic/magnetic lenses, deflectors, correctors (such as stigmators), etc. In normal (non-scanning) TEM mode, this imaging system 24 can focus the transmitted electron flux onto a fluorescent screen 26, which, if desired, can be retracted/withdrawn (as schematically indicated by arrows 26') so as to get it out of the way of axis C'. An image (or diffractogram) of (part of) the specimen S will be formed by imaging system 24 on screen 26, and this may be viewed through viewing port 28 located in a suitable part of a wall of enclosure V. The retraction mechanism for screen 26 may, for example, be mechanical and/or electrical in nature, and is not depicted here.

As an alternative to viewing an image on screen 26, one can instead make use of the fact that the depth of focus of the electron flux emerging from imaging system 24 is generally quite large (e.g. of the order of 1 meter). Consequently, various other types of analysis apparatus can be used downstream of screen 26, such as:

TEM camera 30. At camera 30, the electron flux can form a static image (or diffractogram) that can be processed by controller E and displayed on a display device (not depicted), such as a flat panel display, for example. When not required, camera 30 can be retracted/withdrawn (as schematically indicated by arrows 30') so as to get it out of the way of axis C'.

STEM recorder 32. An output from recorder 32 can be recorded as a function of (X,Y) scanning position of the beam C on the specimen S, and an image can be constructed that is a "map" of output from recorder 32 as a function of X,Y. Recorder 32 can comprise a single pixel with a diameter of e.g. 20 mm, as opposed to the matrix of pixels characteristically present in camera 30. Moreover, recorder 32 will generally have a much higher acquisition rate (e.g. $10^6$ points per second) than camera 30 (e.g. $10^2$ images per second). Once again, when not required, recorder 32 can be retracted/withdrawn (as schematically indicated by arrows 32') so as to get it out of the way of axis C' (although such retraction would not be a necessity in the case of a donut-shaped annular dark field recorder 32, for example; in such a recorder, a central hole would allow beam passage when the recorder was not in use).

As an alternative to imaging using camera 30 or recorder 32, one can also invoke spectroscopic apparatus 34, which could be an EELS module, for example (EELS=Electron Energy-Loss Spectroscopy).

It should be noted that the order/location of items 30, 32 and 34 is not strict, and many possible variations are conceivable. For example, spectroscopic apparatus 34 can also be integrated into the imaging system 24.

Note that the controller (computer processor) E is connected to various illustrated components via control lines (buses) E'. This controller E can provide a variety of functions, such as synchronizing actions, providing setpoints, processing signals, performing calculations, and displaying messages/information on a display device (not depicted). Needless to say, the (schematically depicted) controller E may be (partially) inside or outside the enclosure V, and may have a unitary or composite structure, as desired. The skilled artisan will understand that the interior of the enclosure V does not have to be kept at a strict vacuum; for example, in a so-called "Environmental TEM/STEM", a background atmosphere of a given gas is deliberately introduced/maintained within the enclosure V. The skilled artisan will also understand that, in practice, it may be advantageous to confine the volume of enclosure V so that, where possible, it essentially hugs the axis C', taking the form of a small tube (e.g. of the order of 1 cm in diameter) through which the employed electron beam passes, but widening out to accommodate structures such as the source 4, specimen holder H, screen 26, camera 30, recorder 32, spectroscopic apparatus 34, etc.

In the context of the current invention, and in analogy to the situation in FIG. 1, the microscope M is provided with an interferential optical position sensor (IOPS) P1, P2, P3 for determining a position of the specimen holder H relative to a reference P1. This IOPS can be implemented in a matter similar/identical to that set forth in Embodiment 1 above, and will therefore receive no general elucidation here. However, as a specific further example of how the IOPS can be used as part of a positional compensation scheme, the current embodiment allows the following set-up:

Imaging system 24 is provided with a beam steering module (similar in functionality to item D in illuminator 1) that can be used to adjust a path of flux propagating along axis C' downstream of specimen S;

Controller E (or another controller) is invoked to adjust a steering setpoint supplied to said steering module in response to the abovementioned IOPS signal.

The invention claimed is:

1. A method of using a Charged Particle Microscope comprising:
   determining a position of a specimen holder relative to a reference using an interferential optical position sensor, the optical position sensor producing a time-dependent position signal from said optical position sensor for use by an automatic controller configured to receive said time-dependent position signal from said optical position sensor;
   using said automatic controller for automatically producing a vibration profile for the microscope from the time-dependent position signal; and
   forming an image using the microscope, the image formation process compensating for vibration of the specimen holder relative to the reference using the vibration profile,
   wherein the microscope includes an imaging system for directing a flux of charged particles transmitted through the specimen onto a detector, said imaging system includes a steering module that can be used to adjust a path of said flux, and the controller is invoked to adjust a steering setpoint supplied to said steering module in response to said signal.

2. A method of using a Charged Particle Microscope comprising:
   a specimen holder, connected to a positioning stage, for holding a specimen;
   a source, for producing a beam of charged particles;
   an illuminator, for directing said beam so as to irradiate the specimen; and
   a detector, for detecting a flux of radiation emanating from the specimen in response to said irradiation,
   the method comprising:
   providing the microscope with an interferential optical position sensor for determining a position of said specimen holder relative to a reference;
   providing an automatic controller with a time-dependent position signal from said optical position sensor; and
   invoking said controller to use said signal to produce a vibration profile for the microscope, wherein:
   said signal is used as input to a control procedure to compensate for a positional error of said specimen holder relative to at least one of said illuminator and said detector;
   the microscope is provided with an imaging system, for directing a flux of charged particles transmitted through the specimen onto said detector;
   said imaging system is provided with a steering module that can be used to adjust a path of said flux; and
   the controller is invoked to adjust a steering setpoint supplied to said steering module in response to said signal.

3. A method according to claim 2, wherein the control procedure compensates for positional errors in multiple degrees of freedom, including both linearly and angularly.

4. A method according to claim 2, wherein:
   said control procedure comprises a control loop; and
   said compensation comprises on-the-fly adjustment of a relative position of said beam and said specimen holder.

5. A method according to claim 4, wherein the controller is invoked to adjust a position setpoint supplied to said stage in response to said signal.

6. A method according to claim 4, wherein:
   the illuminator is provided with a deflector mechanism that can be used to adjust a deflection of the beam; and
   the controller is invoked to adjust a deflection setpoint supplied to said deflector mechanism in response to said signal.

7. A method according to claim 2, wherein said signal used as input to the control procedure is used as input for feedforward control.

8. A method according to claim 2, wherein:
   the microscope is provided with scanning means, for producing relative scanning motion of the beam and specimen;
   the controller is invoked to construct a table of detector output as a function of scan coordinate position on the specimen; and
   said compensation comprises retrospective correction of said scan coordinate position on a point-by-point basis.

9. A method according claim 2, wherein:
   a first interferential optical position sensor is used to determine a position of said specimen holder relative to a microscope frame;
   a second interferential optical position sensor is used to determine a position of part of said illuminator relative to said microscope frame;
   said controller utilizes a position signal from each of said first and second optical position sensors to calculate a relative position of said stage and said illuminator.

10. A method according to claim 2, wherein use is made of a filter to adjust effects of vibrations in a selected frequency range.

11. A method according to claim 5, wherein:
    the illuminator is provided with a deflector mechanism that can be used to adjust a deflection of the beam; and
    the controller is invoked to adjust a deflection setpoint supplied to said deflector mechanism in response to said signal.

12. A method according to claim 4, wherein the control procedure compensates for positional errors in multiple degrees of freedom, including both linearly and angularly.

13. A method according to claim 5, wherein the control procedure compensates for positional errors in multiple degrees of freedom, including both linearly and angularly.

14. A method according to claim 6, wherein the control procedure compensates for positional errors in multiple degrees of freedom, including both linearly and angularly.

15. A method according claim 3, wherein:
    a first interferential optical position sensor is used to determine a position of said specimen holder relative to a microscope frame;
    a second interferential optical position sensor is used to determine a position of part of said illuminator relative to said microscope frame; and
    said controller utilizes a position signal from each of said first and second optical position sensors to calculate a relative position of said stage and said illuminator.

16. A method according claim 4, wherein:
- a first interferential optical position sensor is used to determine a position of said specimen holder relative to a microscope frame;
- a second interferential optical position sensor is used to determine a position of part of said illuminator relative to said microscope frame; and
- said controller utilizes a position signal from each of said first and second optical position sensors to calculate a relative position of said stage and said illuminator.

17. A method according to claim 4, wherein use is made of a filter to adjust effects of vibrations in a selected frequency range.

18. A method according to claim 5, wherein use is made of a filter to adjust effects of vibrations in a selected frequency range.

19. A Charged Particle Microscope comprising:
- a specimen holder, connected to a positioning stage, for holding a specimen;
- a source, for producing a beam of charged particles;
- an illuminator, for directing said beam so as to irradiate the specimen;
- a detector, for detecting a flux of radiation emanating from the specimen in response to said irradiation;
- an interferential optical position sensor for determining a position of said specimen holder relative to a reference;
- an automatic controller configured to receive a time-dependent position signal from said optical position sensor; and
- an imaging system for directing a flux of charged particles transmitted through the specimen onto said detector, wherein the imaging system includes a steering module that can be used to adjust a path of said flux; and
- said controller is configured to use said time-dependent position signal from said optical position sensor to produce a vibration profile for the microscope, said controller is further configured to use said signal as input to a control procedure to compensate for a positional error of said specimen holder relative to at least one of said illuminator and said detector, and said controller is additionally configured to adjust, on being invoked, a steering setpoint supplied to said steering module in response to said signal.

20. A microscope according to claim 19, wherein said controller is configured to use said signal as input to a control procedure that compensates for positional errors in multiple degrees of freedom, including both linearly and angularly.

* * * * *